United States Patent
Hutter et al.

(10) Patent No.: US 9,804,242 B2
(45) Date of Patent: Oct. 31, 2017

(54) TIME-RESOLVED PHASE-CONTRAST MR IMAGING WITH SPEED ENCODING

(71) Applicants: Jana Hutter, Effeltrich (DE); Peter Schmitt, Weisendorf (DE)

(72) Inventors: Jana Hutter, Effeltrich (DE); Peter Schmitt, Weisendorf (DE)

(73) Assignee: Siemens Aktiengesellschaft, Munich (DE)

(*) Notice: Subject to any disclaimer, the term of this patent is extended or adjusted under 35 U.S.C. 154(b) by 895 days.

(21) Appl. No.: 14/221,645

(22) Filed: Mar. 21, 2014

(65) Prior Publication Data

US 2014/0285194 A1 Sep. 25, 2014

(30) Foreign Application Priority Data

Mar. 21, 2013 (DE) .................. 10 2013 204 994

(51) Int. Cl.
*G01R 33/56* (2006.01)
*G01R 33/563* (2006.01)
*G01R 33/561* (2006.01)

(52) U.S. Cl.
CPC ......... *G01R 33/56* (2013.01); *G01R 33/5608* (2013.01); *G01R 33/56316* (2013.01); *G01R 33/5611* (2013.01)

(58) Field of Classification Search
CPC G01R 33/56; G01R 33/5608; G01R 33/5611; G01R 33/56316
See application file for complete search history.

(56) References Cited

U.S. PATENT DOCUMENTS

| 4,609,872 | A | * | 9/1986 | O'Donnell | ....... G01R 33/56308 324/306 |
| 8,934,965 | B2 | * | 1/2015 | Rogers | ................. A61B 5/0478 600/378 |
| 2007/0009080 | A1 | | 1/2007 | Mistretta | |
| 2008/0085040 | A1 | * | 4/2008 | Basu | ..................... G06T 11/005 382/128 |

(Continued)

OTHER PUBLICATIONS

Hutter et al., "Multi-Dimensional Flow-Adapted Compressed Sensing (MDFCS) for Time-Resolved Velocity-Encoded Phase Contrast MRA," Biomedical Imaging (ISBI), IEEE 10th International Symposium, pp. 13-16 (2013).

(Continued)

*Primary Examiner* — Dixomara Vargas
(74) *Attorney, Agent, or Firm* — Schiff Hardin LLP

(57) ABSTRACT

In a method and apparatus for time-resolved phase-contrast magnetic resonance (MR) imaging with speed encoding, MR signals are detected with multiple receivers in each of numerous time segments in order to acquire raw data in each of the time segments, in each case for numerous MR images with different speed encodings. Stationary image points and/or non-stationary image points are identified, dependent on the detected MR signals. A mask is defined, dependent on the identified stationary image points and/or the non-stationary image points, wherein the mask is locally variable. The numerous MR images for the numerous time segments are reconstructed from the acquired raw data, wherein the reconstruction occurs in an iterative process and with a temporal regularization, which is dependent on the mask.

19 Claims, 9 Drawing Sheets

(56) References Cited

U.S. PATENT DOCUMENTS

| | | | |
|---|---|---|---|
| 2008/0095300 A1* | 4/2008 | Zingelewicz | G01N 23/04 378/4 |
| 2009/0092303 A1 | 4/2009 | Griswold et al. | |
| 2011/0044524 A1 | 2/2011 | Wang et al. | |
| 2013/0049752 A1 | 2/2013 | Hutter et al. | |
| 2014/0309521 A1* | 10/2014 | Wang | G01R 33/56316 600/419 |
| 2015/0061671 A1* | 3/2015 | Greiser | G01R 33/56316 324/309 |

OTHER PUBLICATIONS

Hutter et al.,"Highly undersampled time resolved phase-contrast MRA with flow-adapted compressed sensing reconstruction," Proc. Intl. Soc. Mag. Reson. Med., vol. 21, p. 3811 (2013).

Kim et al., "Accelerated Phase-Contrast Cine MRI using k-t Sparse-Sense", Magnetic Resonance in Medicine, vol. 67 (2012) pp. 1054-1064.

* cited by examiner

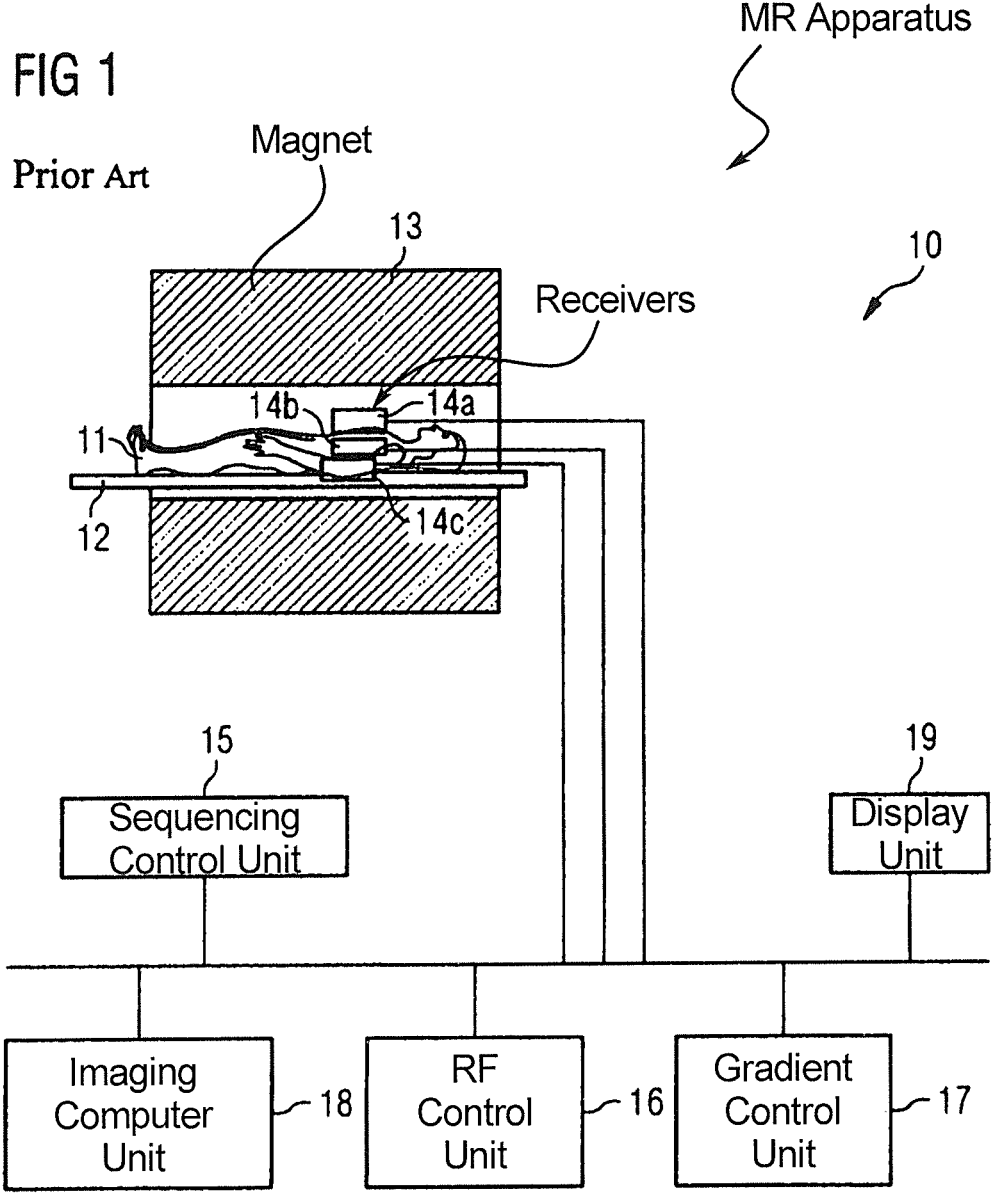

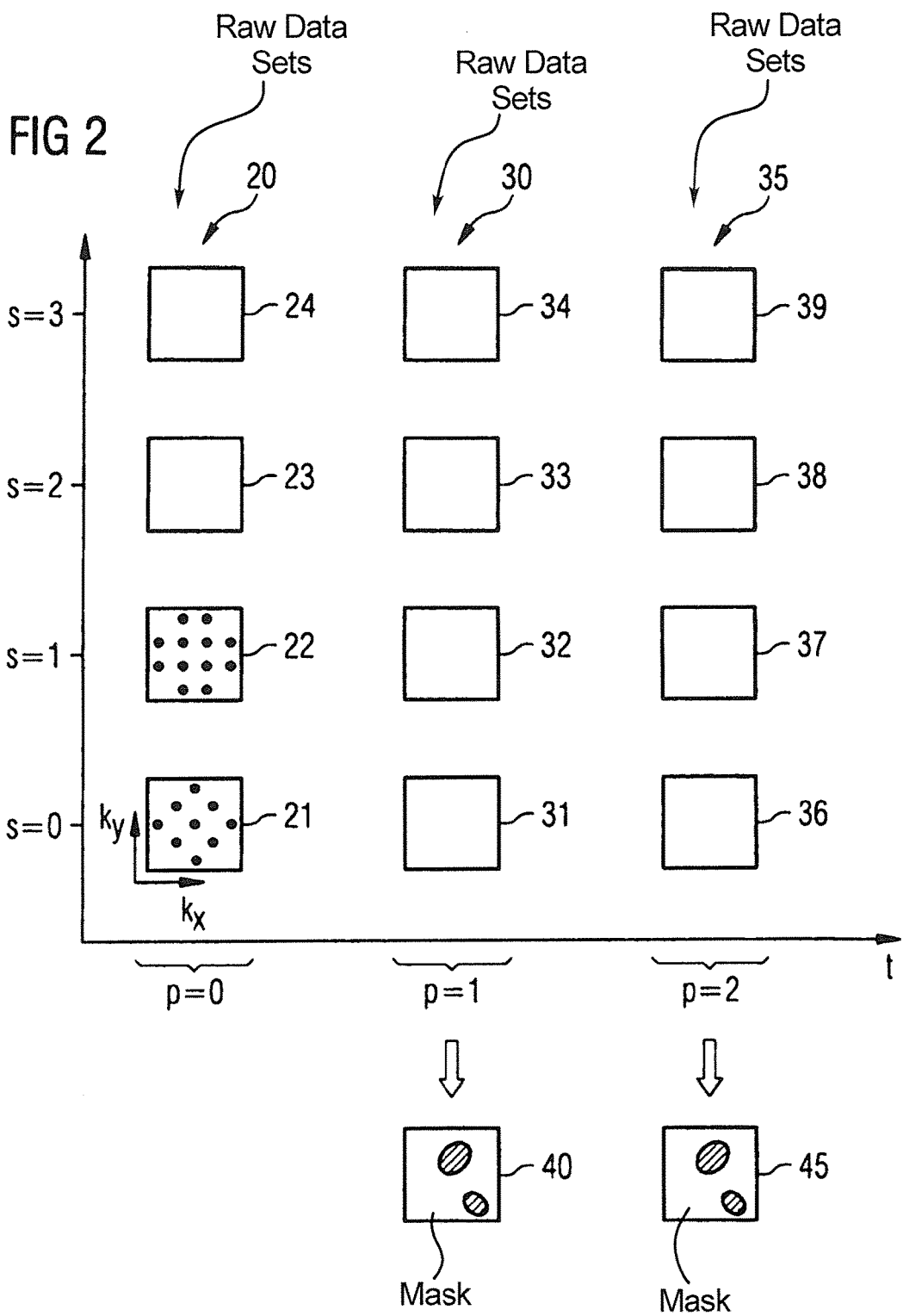

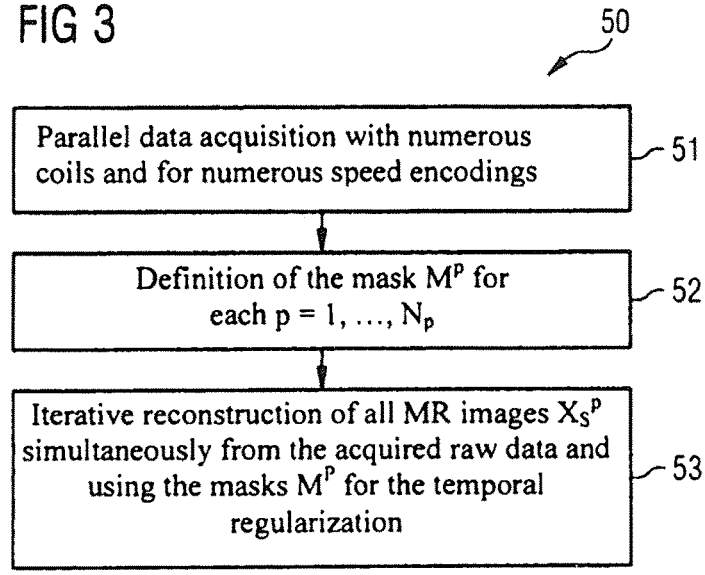
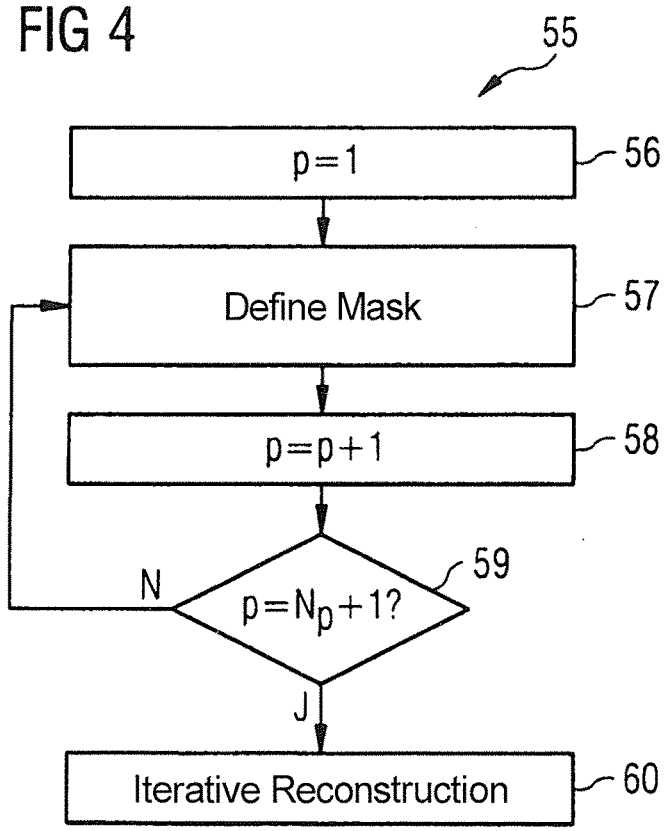

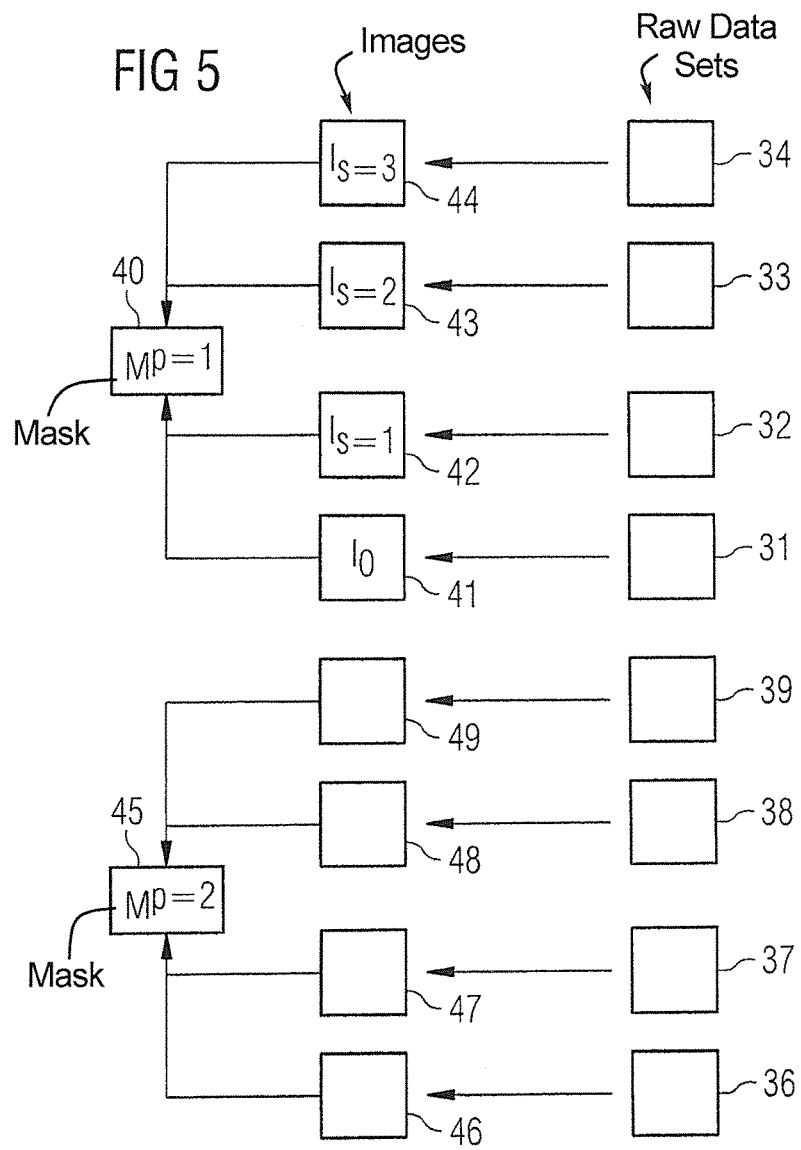
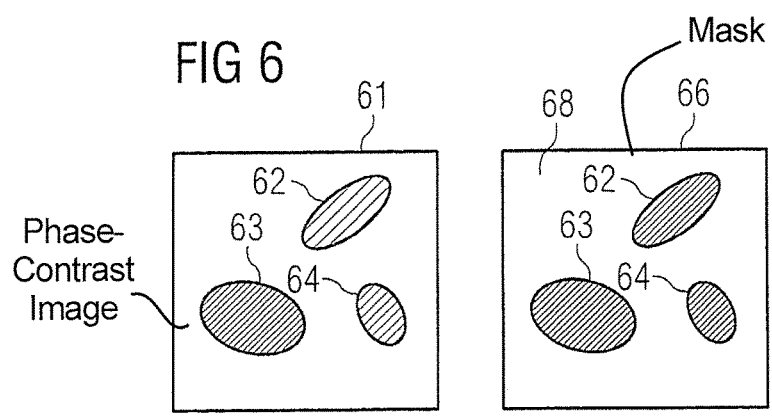

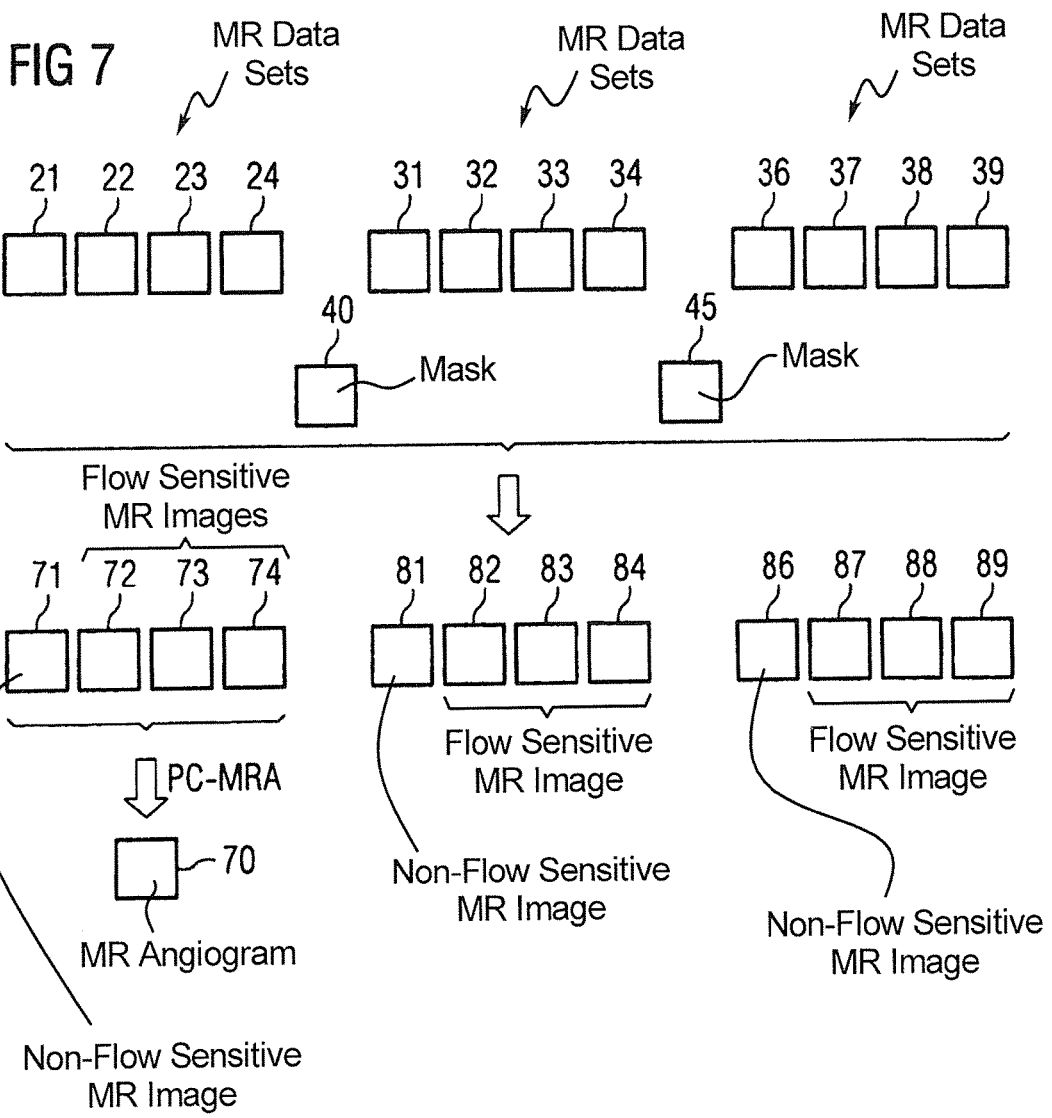

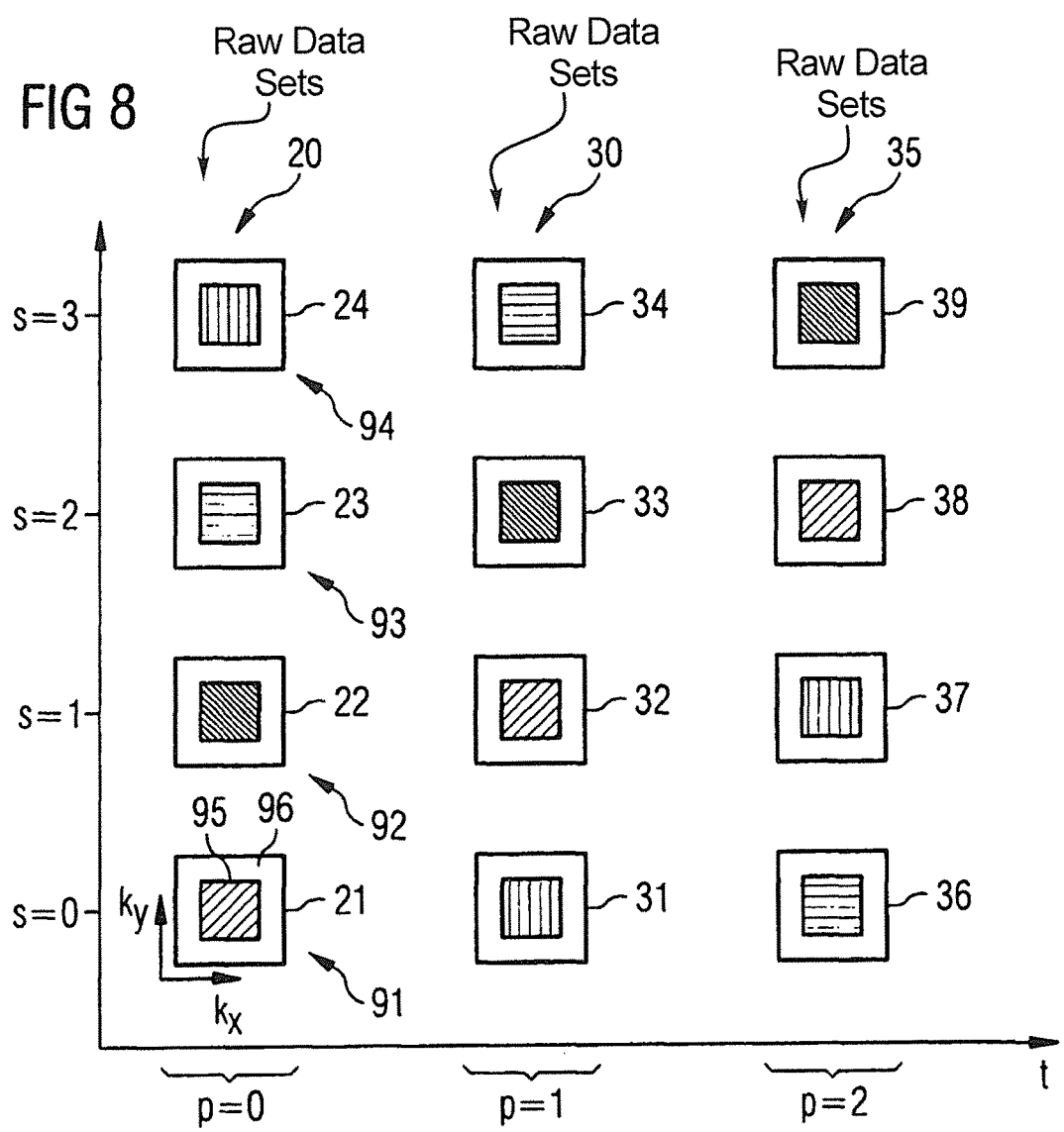

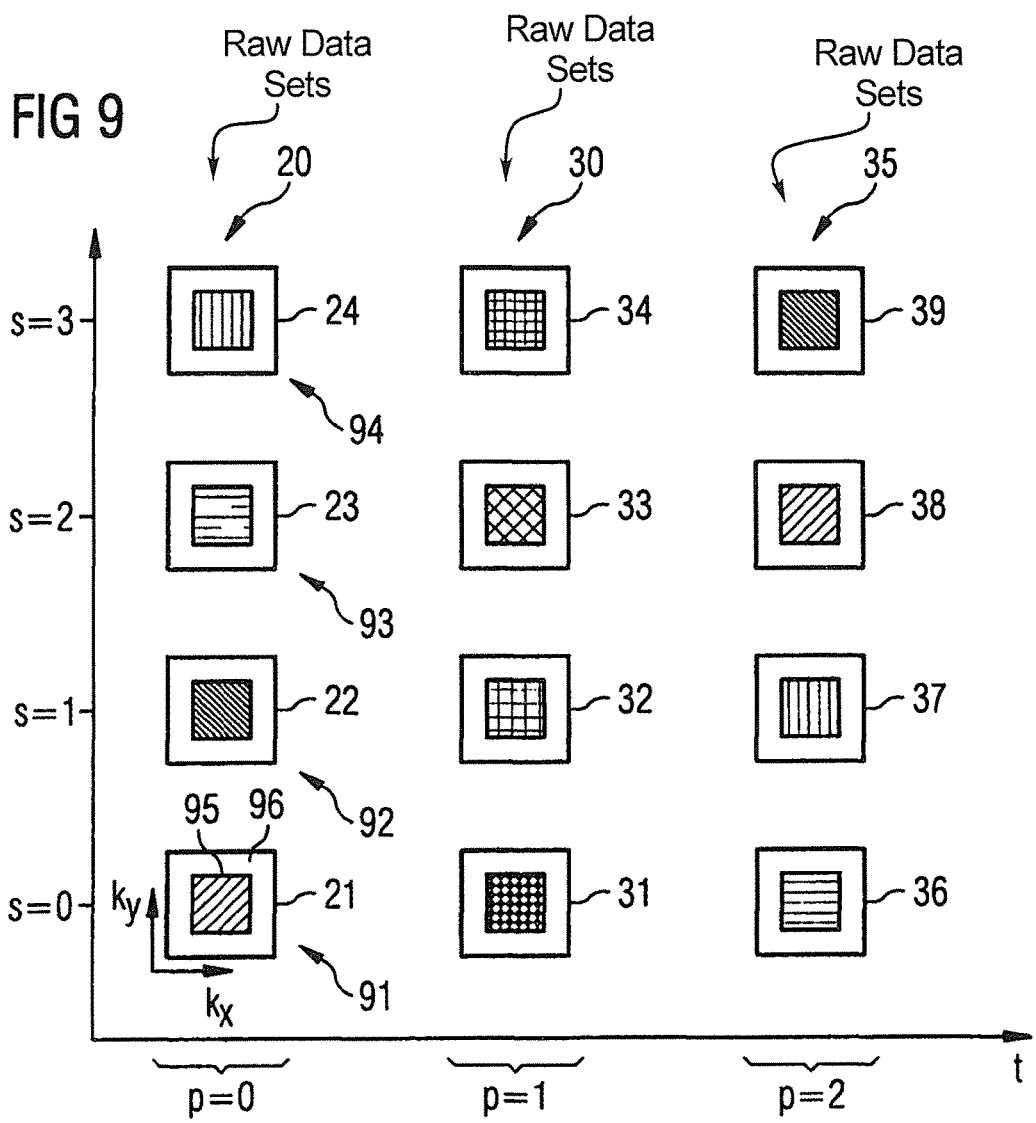

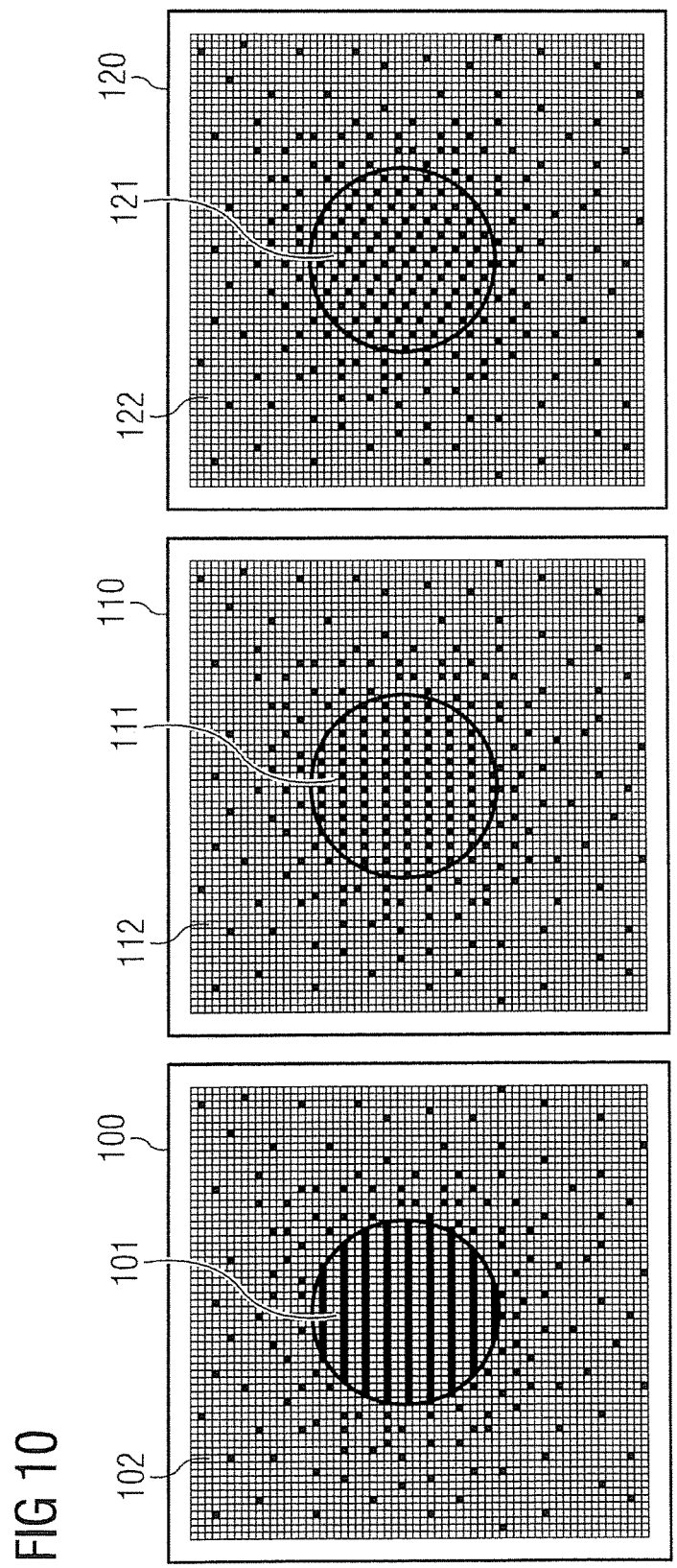

TIME-RESOLVED PHASE-CONTRAST MR IMAGING WITH SPEED ENCODING

BACKGROUND OF THE INVENTION

Field of the Invention

The invention relates to a method for creating time-resolved magnetic resonance (MR) images of an examination subject and a magnetic resonance apparatus for this. The invention relates, in particular, to methods and MR apparatuses that enable time-resolved imaging of flow rates.

Description of the Prior Art

The local and temporal resolved imaging of flow rates has multiple applications, such as the examination of the heart, for example. A multi-dimensional phase-contrast MR imaging can be used for measuring flow rates. For a time-resolved determination of the speed, data must be acquired for numerous different speed encodings for numerous time segments. In addition to a data acquisition with a sequence having flow compensation, at least one other data acquisition is made, in which the speed encoding gradients are applied such that speeds along a certain spatial direction are recorded, for example. The large number of dimensions of the data space (temporal resolution, two to three spatial directions, speed encoding in one or more spatial directions) results in long data acquisition times.

To reduce the data acquisition times, parallel imaging methods and methods with underscanning have been developed into valuable and promising methods. The use of conventional SENSE ("Sensitivity Encoding") or GRAPPA ("Generalized Autocalibrating Partially Parallel Acquisition") methods can result in the problem that with an imaging with speed encoding, the acceleration factors are not particularly large, and/or a contrast/noise relationship is strongly deteriorated. Daniel Kim et al., "Accelerated Phase-Contrast Cine MRI using k-t SPARSE-SENSE," Magn Reson Med. 2012 Apr.; 67(4), Pages 1054-1064, describes a method for phase-contrast MR imaging, which likewise combines a parallel data recording with numerous receivers and underscanning. DE 10 2011 081 411.6 describes a scanning pattern for an MR imaging, in which the MR images are calculated using iterative reconstruction methods.

SUMMARY OF THE INVENTION

An object of the present invention is to provide methods and apparatuses for time-resolved phase-contrast MR imaging with speed encoding, which result in a good contrast/noise relationship and reconstructed MR images of good quality, even when a recording technique that reduces the recording time, such as underscanning in combination with parallel data acquisition, is used.

According to one aspect of the invention, in a method and a magnetic resonance apparatus for time-resolved phase-contrast MR imaging with speed encoding, MR images are reconstructed in an iterative reconstruction method. A temporal regularization is used in the reconstruction. The temporal regularization is dependent on which image points represent flowing spins, and which image points do not represent flowing spins. This allows MR images with a good contrast/noise relationship and good image quality to be reconstructed, even with underscanning (undersampling).

An underscanning can be used such that different scanning patterns are used for different speed encodings. The allocation of scanning patterns to speed encodings can be permuted as a function of time. By this means, a good contrast/noise relationship and a good image quality can be obtained, even with a limited recording time.

A method for time-resolved phase-contrast MR imaging with speed encoding includes a detection of MR signals with numerous receivers in each of numerous time segments. With the data acquisition, raw data are acquired in each of the time segments for numerous respective MR images with different speed encodings. Stationary image points and/or non-stationary image points are identified in relation to the detected MR signals. A mask is calculated in relation to the identified stationary image points and/or non-stationary image points, wherein the mask is locally variable. The multiple MR images for the multiple time segments are reconstructed in an iterative manner from the acquired raw data. The reconstruction is carried out with a temporal regularization, which is dependent on the mask.

By the reconstruction of the multiple MR images with an iterative reconstruction method, the MR images for different speed encodings and different time segments can be simultaneously reconstructed. The temporal regularization takes into account, through the use of the mask, the image regions in which stationary tissue without flowing spins is present. Artifacts thus can be prevented, and the contrast/signal relationship can be improved.

As stationary image points, those image points are indicated here that represent tissues in which no flowing spins are present. The non-stationary image points contain, in particular, regions of an examination subject in which, for example, a blood flow is present.

The mask can be calculated such that, with the reconstruction, time dependent changes to the stationary image points are suppressed. For this purpose, the mask can be set at a first value for image points corresponding to stationary tissues, and at all of the other image points, at a second value, differing therefrom. The second value can be zero. As a result, for those image regions having flowing spins, it can be ensured that data regarding time-dependent changes are not lost during the iterative reconstruction.

For the reconstruction, a target function can be minimized, which comprises a regularization term for temporal regularization. A mask for each time step can define a location-dependent quantifier for the regularization term. In this manner, the data regarding stationary and/or non-stationary image points can be used in the reconstruction.

The regularization term can be dependent on a difference between a first MR image and a second MR image, wherein the first MR image and the second MR image correspond to successive time segments. In the regularization term, the difference can be weighted by means of the locally variable mask, as a function thereof, in order to determine whether an image point is a stationary image point or a non-stationary image point. The first MR image and the second MR image can have the same speed encoding.

The target function relates to raw data acquired in numerous different time segments. This enables the simultaneous creation of the numerous MR images for the numerous time segments in an iterative reconstruction procedure.

The regularization term can be a function of $$\|\vec{M}^p \cdot (\vec{X}_s^p - \vec{X}_s^{p-1})\|_{L_n} \quad (1)$$

wherein, p is an index for a time segment. The index s is an index for a speed encoding. The factor $\vec{M}^p$ is the mask for a $p^{th}$ time segment. The factor $\vec{X}_s^p$ is a vector having image points of an MR image for the $p^{th}$ time segment with the $s^{th}$ speed encoding, and $\vec{X}_s^{p-1}$ is a vector having image points of an MR image for the $(p-1)^{th}$ time segment has the $s^{th}$ speed encoding. The symbol $\|\cdot\|_{L_n}$ indicates an $L_n$ norm. In particular, an $L_1$ norm can be used for the regularization term. A regularization term having the form given in equation (1), which is dependent on the mask, can only be selectively used for MR images recorded with a data acquisition that is sensitive to a spin flowing in one direction. For flow-compensated MR images, no filtering with the mask is necessary, because the flow-compensated MR images basically only record stationary tissue.

The identification of stationary and/or non-stationary image points and the calculation of the mask can, in each case, be carried out for each of numerous time segments. Errors in the determination of stationary and non-stationary image points can thus be more easily averaged out during the reconstruction, and an influence from artifacts can be reduced.

In order to identify stationary and non-stationary image points for a time segment, a phase-contrast image for the respective time segment can be created. The locally variable mask can be created based on the phase-contrast image by means of a threshold value comparison. In this manner, it is possible to easily determine those image points at which there is a flow. At these image points, the temporal resolution should also be maintained when there is a temporal regularization.

In each of the numerous time segments, the detection of the MR signals can occur such that for the numerous different speed encodings, a raw data space is filled, in each case incompletely, with raw data. As a result of an underscanning in this manner, the recording time can be reduced.

The raw data space can, in each case, be filled with raw data according to a scanning pattern. A different scanning pattern can be used in each time segment for the numerous different speed encodings. As an example, a data acquisition can occur with flow compensation with a first scanning pattern in a specific time segment. A flow sensitive data acquisition having a first speed encoding direction can occur with a second scanning pattern. A flow sensitive data acquisition with a second speed encoding direction can occur with a third scanning pattern. A flow sensitive data acquisition with a third speed encoding direction can occur with a fourth scanning patter. Through the variation in scanning patterns, which are used for different speed encodings, the quality of the reconstructed MR images can be improved. An incoherency between different speed encodings can be increased.

An allocation of the different scanning patterns to speed encodings can be permuted in a time-dependent manner. Thus, in a further time segment, a data acquisition with flow compensation can occur with the second scanning pattern. A data acquisition with the first speed encoding direction can occur with the third scanning pattern. A data acquisition with the second speed encoding direction can occur with the fourth scanning pattern. A data acquisition with the third speed encoding direction can occur with the first scanning pattern. For subsequent time segments, the sequence can be further permuted. The sequence can be permuted in cycles. Alternatively, or in addition, different scanning patterns can be used in different time segments. As an example, in one time segment, a first group of scanning patterns can be used. In a second time segment, a second group of scanning patterns can be used. At least one of the scanning patterns in the second group can be different than all of the scanning patterns in the first group. All patterns in the second group can be different than all of the patterns in the first group.

Through the establishment of different scanning patterns for the data acquisition with different speed encodings, it is possible for the data from different speed encodings and from different time segments to contribute to an improvement of the image quality.

The different scanning patterns can be organized in a central region of the raw data space such that each point in the central region is scanned by means of at least one of the different scanning patterns.

Each of the different scanning patterns can be selected such that in the central region of the raw data space, the raw data space is underscanned with a coherent pattern, which is composed of a spatially repeating quantity of raw data points. Outside of the central raw data region, the scanning pattern can be such that an incoherent underscanning occurs.

The reconstruction can be dependent on sensitivity charts of the numerous receivers. The iterative reconstruction can be carried out with a Newtonian iteration method. Other iterative resolution methods, with which the one target function minimizing vector is defined, can also be used.

According to a further aspect of the invention, an MR apparatus has a data acquisition unit (scanner) and an imaging computer. The scanner is designed for detecting MR signals with multiple receivers in each of numerous time segments, for acquiring raw data in each of the time segments, in each case for multiple MR images with different speed encodings. The imaging computer is configured for reconstructing the numerous MR images from the acquired raw data. The imaging computer is configured for identifying stationary image points and/or non-stationary image points, depending on the detected MR signals. The imaging computer is configured to calculate a mask, dependent on the detected stationary image points and/or non-stationary image points, wherein the mask is locally variable. The imaging computer is configured to reconstruct the numerous MR images for the numerous time segments from the acquired raw data with a temporal regularization in an iterative procedure, wherein the temporal regularization is dependent on the mask.

The effects that are targeted with the MR apparatus correspond to the effects explained in reference to the method. Other features of the MR apparatus according to embodiment examples correspond to the corresponding method features. The imaging computer is configured for executing the corresponding processing steps. The scanner is configured for executing a data acquisition according to the corresponding method features.

The use of different scanning patterns for underscanning for different speed encodings can also be used with methods and MR apparatuses in which no temporal regularization is implemented and/or no mask, dependent on stationary image points, is generated.

A method is thus defined, according to another aspect of the invention, for time-resolved phase-contrast magnetic resonance imaging with speed encoding. MR signals are detected thereby with numerous receivers in each of numerous time segments, for acquiring raw data, in each case for numerous MR images with different speed encodings. In each of the numerous time segments, a data acquisition occurs such that, for the numerous different speed encodings, a raw data space is filled with raw data, incompletely in each case, according to a scanning pattern, and such that different scanning patterns are used for the numerous different speed encodings. The MR images for the different speed encodings and for the numerous time segments are reconstructed from the detected MR signals.

As a result of the change in the scanning patterns, which are used for different speed encodings, the quality of the reconstructed MR images can be improved. An incoherence between data sets, corresponding to different speed encodings, can be increased. A good image quality, particularly a good contrast/noise relationship, can be obtained.

Further features of the scanning pattern, such as a time-dependent permutation and/or a nesting in a central region of the raw data space, correspond to the features already explained above.

According to another aspect of the invention, an MR apparatus for time-resolved phase-contrast MR imaging with speed has a scanner and an imaging computer. The scanner is configured for detecting MR signals with numerous receivers in each of numerous time segments, in order to acquire raw data in each of the time segments, in each case for numerous MR images having different speed encodings. The scanner is designed such that, in each of the numerous time segments, a raw data space is filled, incompletely in each case, with raw data for the numerous different speed encodings, according to a scanning pattern, wherein the scanning patterns are different for the numerous different speed encodings. The imaging computer is configured for reconstructing the MR images of the numerous time segments and the different speed encodings from the acquired raw data.

The effects that are to be obtained with the MR apparatus correspond to the effects explained in reference to the method. Further features of the MR apparatus according embodiment examples correspond to the corresponding method features. The scanner is configured thereby for executing a data acquisition according to method features.

With apparatuses and methods according to embodiment examples, the reconstruction can be dependent on sensitivity charts of the numerous receivers. The iterative reconstruction can be executed with a Newtonian iteration procedure. Other iterative resolution procedures, with which the one target function minimizing vector is determined, can also be used.

BRIEF DESCRIPTION OF THE DRAWINGS

FIG. 1 schematically illustrates a conventional MR apparatus, which can be configured to execute methods according to embodiments of the invention.

FIG. 2 schematically shows raw data sets, which are acquired with methods according to embodiment examples.

FIG. 3 is a flowchart for a method according to an embodiment of the invention.

FIG. 4 is a flowchart for a method according to another embodiment of the invention.

FIG. 5 illustrates data processing in the methods of FIG. 3 and FIG. 4.

FIG. 6 illustrates generation of a mask for an iterative reconstruction procedure in accordance with the invention.

FIG. 7 illustrates data processing in the method of FIG. 3.

FIG. 8 schematically shows raw data sets, which are acquired with a method according to an embodiment of the invention.

FIG. 9 schematically shows raw data sets, which are acquired with a method according to another embodiment of the invention.

FIG. 10 shows examples of scanning patterns, which can be implemented with a method according to an embodiment of the invention.

DESCRIPTION OF THE PREFERRED EMBODIMENTS

Figure 11:
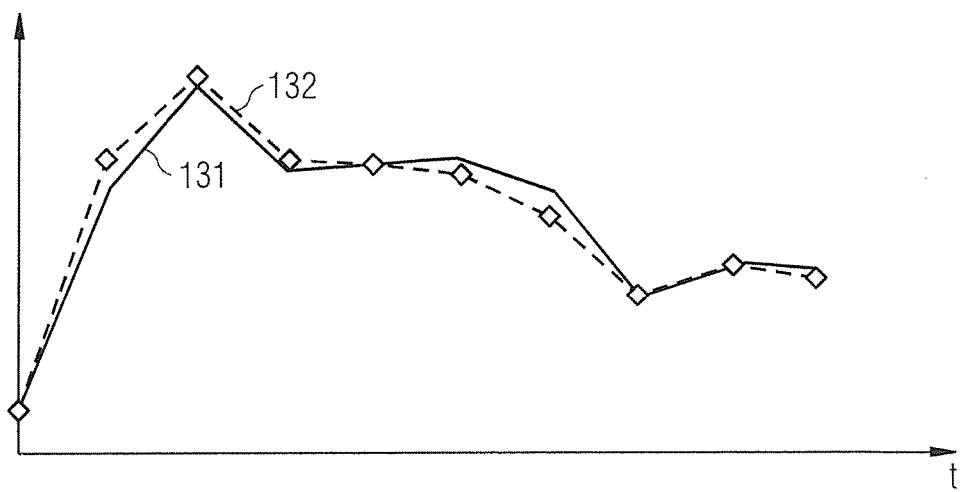
FIG. 11 and FIG. 12 show time-resolved flow measurement values, which are determined with a method according to an embodiment of the invention.

FIG. 1 shows an MR apparatus 10, with which MR images of an examination subject 11 placed on a bed 12 can be recorded. The magnetization generated by a magnet 13 is encoded in terms of location, and deflected through the application of magnetic field gradients and RF impulses, wherein the MR signals are detected with numerous receivers 14a-14c. The receivers 14a-14c can be designed as MR signal coils, which are disposed around the examination subject 11. A sequencing control unit 15 controls, in dependence on the selected imaging sequence, the application of the magnetic field gradients, the RF pulses and the signal readout, and establishes the sequence of the gradient application, the irradiation of the RF pulses and the signal readout. The sequencing control unit 15 controls an RF control unit 16, which in turn is responsible for controlling the irradiated high frequency impulses. A gradient control unit 17 is responsible for the application of the magnetic field gradients, which, for example, can be defined by the sequencing control unit 15. An imaging computer unit 18 computes MR images from the MR signals detected by the receivers 14a-14c, wherein the MR images are reconstructed with iterative reconstruction methods, as shall be explained in greater detail in the following. The MR images generated by the imaging computer unit 18 can be displayed on a display unit 19. An operator can control the MR apparatus 10 by means of an input unit. The function of the sequencing control unit 15, the RF control unit 16, the gradient control unit 17 and/or the imaging computer unit 18, can also be carried out from the same unit, e.g. a computer, which is configured for executing the aforementioned control and evaluation steps.

According to an exemplary embodiment of the invention, the MR apparatus 10 is configured for executing a time-resolved phase-contrast MR imaging with speed encoding. In order to obtain data regarding a blood flow or a flowing substance in the examination subject 11, speed encoding gradients are applied. For multiple successive time segments, at least one data acquisition with flow compensation is executed in each case. Furthermore, for each of the multiple time segments, at least one recording is carried out in each case, which detects flowing spins along a speed encoding direction. For this purpose, a speed encoding gradient can be applied such that a speed encoding can be obtained, for example, along a predefined speed encoding direction. Suitable techniques and sequences are known to those skilled in the art, and need not be explained in further detail herein. Likewise, the manner in which MR signals can be detected from the sequence of magnetic field gradients and the irradiation of RF impulses is known to those skilled in the art, such that the techniques for this need not be explained in detail herein.

The data acquisition can occur in coordination with a physiological cycle. For example, an EKG triggering can be used, in order to execute the data acquisition in coordination with a cardiac cycle.

FIG. 2 shows, schematically, a data set, which is acquired and processed in methods according to embodiment examples. Data sets (subsets) for numerous different speed encodings are recorded for each of numerous successive time segments. The time segments are indicated by the index p. The different speed encodings are indicated by the index s.

In a time segment p=0, numerous raw data sets 20 are acquired. A raw data set 21 is recorded with a flow compensated (i.e. non-flow sensitive) sequence. In addition, at least one further raw data set 22 is recorded such that spins moving along a specific direction can be identified. For this, a speed encoding along a first spatial direction can be set, which is the speed encoding direction for this data acquisition.

As is schematically illustrated in FIG. 2, it is also possible to acquire more than one raw data set with a flow sensitive data acquisition in each time segment. As an of example, the other raw data set 23 can be recorded with a flow sensitive data recording, such that a speed encoding along a second spatial direction can be set. The other data set 24 can be recorded with a flow sensitive data recording, such that a speed encoding is set along a third spatial direction. The first, second and third spatial directions can be orthogonal to one another.

Accordingly, in later time segments p=1 and p=2, numerous raw data sets 30, 35 can be acquired in each case. For this, a flow compensated, i.e. non-flow sensitive, data recording for acquiring a raw data set 31 and a raw data set 36, are used in each case. Flow sensitive data recordings are used for acquiring raw data sets 32-34 and 37-39.

With each of the data acquisitions, a raw data space can be underscanned, such that it is incompletely filled with raw data. This is schematically illustrated for the raw data sets 21, 22. Features of scanning patterns that can be used with embodiment examples shall be explained in greater detail in reference to FIG. 8-FIG. 10.

Although a 2D raw data space is schematically depicted in FIG. 2, the methods and MR apparatuses described herein can also be used for data acquisition in three spatial dimensions. The data for this are acquired in parallel, with numerous receivers.

The reconstruction of MR images for the different time segments p=0, 1, . . . , $N_p$ and the different speed encodings s=0, 1, . . . , can occur through iterative reconstruction. For this purpose, a vector $\vec{x}$ can be defined, for which a target function $$D(\vec{x}) + \alpha \cdot R(\vec{x}) \quad (2)$$

is minimized. The factor $D(\vec{x})$ in equation (2) indicates how well the actual detected measurement values are represented for MR images having image points that are defined by a vector $\vec{x}$. The factor $D(\vec{x})$ is frequently also referred to as a so-called "data fidelity term." The factor $D(\vec{x})$ is dependent on the raw data that are acquired by the receivers in all time segments p=0, 1, . . . , $N_p$ and for all speed encodings s=0, 1, . . . , $N_s$.

The term $R(\vec{x})$ in equation (2), which shall be explained below in greater detail, is a temporal regularization term. Other regularization terms can be used alternatively or additionally. The techniques described herein, for the local weighting of a temporal regularization dependent on flow speeds of spins, can be used independently of the specific implementation of the regularization. By way of example, the described techniques can also be used in combination with TV ("total variation") regularization, wavelets and/or other regularization methods.

The vector $\vec{x}$ contains the image points of the MR images for the $N_p$+1) time segments and the ($N_s$+1) different speed encodings as its vector components. For the raw data set depicted in FIG. 2, $N_s$+1=4. Each of these, ($N_p$+1)·($N_s$+1) MR images has $N_x \cdot N_y \cdot N_z$ image points, wherein $N_x$, $N_y$ and $N_z$ indicate the number of image points for each MR image along the three spatial directions. The image points are typically complex numbers. The vector $\vec{x}$ can be depicted in a block format, e.g. in the following form:

$$\vec{x} = \begin{pmatrix} \vec{X}_{s=0}^{p=0} \\ \vec{X}_{s=1}^{p=0} \\ \vdots \\ \vec{X}_{s=N_s}^{p=N_p} \end{pmatrix}. \quad (3)$$

Each vector $\vec{x}_s^p$ contains the image points $N_x \cdot N_y \cdot N_z$ of the MR image for the time segment p and speed encoding s thereby. Any other suitable basis can be used for defining the vector $\vec{x}$.

Through defining the vector $\vec{x}$, for which the target function of equation (2) has a minimum, all of the MR images are reconstructed simultaneously, i.e. the MR images for all of the time segments p=0, . . . ; $N_p$ and for all of the speed encodings s=0, . . . , $N_s$. The solution for equation (2) is obtained by means of an iterative method. The solution for equation (2) can be obtained by a Newtonian iteration procedure. The solution of equation (2) can be executed with a Broyden-Fletcher-Goldfarb-Shanno (BFGS) method. Other iterative solution methods, with which the argument can be found such that a target function is minimized, can also be used. The implementation of iterative methods of this type for obtaining the vector $\vec{x}$, for which a target function is minimized, are known to those skilled in the art.

The raw data acquired with the receivers 14a-14c in the time segment p and for the speed encoding s can be combined in a vector $\vec{Y}_{s,j}^p$. The index j indicates one of the receivers 14a-14c. The overall number of receivers, $N_j$, is at least two.

With an underscanning of the k-space during the data acquisition, each of the vectors $\vec{Y}_{s,j}^p$ has less than $N_x \cdot N_y \cdot N_z$ vector elements.

The term $D(\vec{x})$ in equation (2) can be defined, for example, as $$D(\vec{x}) = \sum_{p=0}^{N_p} \sum_{s=0}^{N_s} \sum_{j=1}^{N_j} \left\| A_{s,j}^p \vec{x} - \vec{Y}_{s,j}^p \right\|_2^2. \quad (4)$$

The matrix $A_{s,j}^p$ thereby is, in each case, dependent on a sensitivity chart $C_j$. The sensitivity chart $C_j$ for the corresponding receiver to which the index j is allocated, can define the sensitivity of this receiver for different k-space points. The matrix $A_{s,j}^p$ can furthermore be dependent on a projection matrix $U_s^p$, which defines the underscanning for the time segment p and the speed encoding s. The projection matrix $U_s^p$ can vary as a function of s and as a function of p. On the whole, a number of different scanning patterns, and thus different projection matrices $U_s^p$, can be used, which is equal to the number ($N_s$+1) of recording sequences with different speed encodings.

The matrix $A_{s,j}^p$ can, for example, in each case be depicted as $$A_{s,j}^p = U_s^p F C_j. \quad (5)$$

For this, F indicates a matrix of Fourier coefficients. The determination of the Fourier coefficient matrix F and the sensitivity chart $C_j$ for a parallel data acquisition with numerous receivers is known to the person skilled in the art, and shall not be described here in detail.

Other definitions of the terms $D(\vec{x})$ in the equation (2) can be used, which define a deviation between the raw data expected for the vector $\vec{x}$ and the actual acquired raw data in a suitable norm. The quadratic form of the equation (4) enables the use of particularly efficient numerical solution methods.

The term $R(\vec{x})$ in equation (2) is a temporal regularization term. Solutions for the reconstructed MR images are suppressed by this term, with which strong temporal changes to the image points occur, at which there are no flowing spins. Image points of this type are also referred to here as stationary image points. The scalar value α in equation (2) determines how strongly time-dependent changes to the stationary image points are to be suppressed in solving the equation (2).

The regularization term can be dependent on the differences $\vec{x}_s^p - \vec{x}_s^{p-1}$ between two MR images, which correspond to successive time segments p and p−1, and are recorded with the same speed encodings, i.e. with the same speed encoding direction, for example. The difference can be weighted with a locally variable mask. The locally variable mask can define weighting factors dependent on the imaging points for the imaging points of the difference image $\vec{x}_s^p - \vec{x}_s^{p-1}$. The mask can, at least for all flow sensitive recordings, i.e. for s=1, ..., $N_s$, weight those image points of the difference image more weakly in the regularization term, where flowing spins are present. As an example, the mask can be selected such that it has a first value for all of the image points where there is no flowing spin present, with which the difference at the corresponding image point $\vec{x}_s^p - \vec{x}_s^{p-1}$ is weighted in the regularization term. At all of the image points where there is a flowing spin present, the mask can have a second value, which is lower than the first value. The second value can be zero. Other designs of the mask can be selected, which, in the regularization term, in any case, for the flow sensitive recording, suppresses temporal changes at the image points corresponding to flowing spins less than the temporal changes at image points corresponding to those having no flowing spins.

For the flow sensitive recordings, i.e. for s=1, ..., $N_s$, the corresponding contribution to the regularization term can be defined as $$\|\vec{M} \cdot (\vec{X}_s^p - \vec{X}_s^{p-1})\|_{L_n} \qquad (6)$$

In this case, the vector $\vec{M}$ indicates the mask. By means of the mask, it is prevented that, with the iterative reconstruction, temporal resolution of the phase in those image regions is lost. With $\|\cdot\|_{L_n}$ the amount is indicated according to the $L_n$ norm in equation (6). Other norms can also be used. For the regularization term, the $L_1$ norm, in particular, can be used.

The mask $\vec{M}$ can be dependent on the corresponding time segment p, as shall be explained in greater detail. The regularization term can, accordingly, be a function of $$\sum_{p=0}^{N_p} \sum_{s=1}^{N_s} \|\vec{M}^p \cdot (\vec{X}_s^p - \vec{X}_s^{p-1})\|_{L_n}. \qquad (7)$$

For this, $\vec{M}^p$ indicates the mask for the $p^{th}$ time segment.

For the non-flow sensitive MR image, no local weighting dependent on a flow speed need be used in the regularization term.

The regularization term $R(\vec{x})$ in equation (2) for temporal regularization can, for example, be defined as $$R(\vec{x}) = \sum_{p=1}^{N_p} \left( \|\vec{X}_{s=0}^p - \vec{X}_{s=0}^{p-1}\|_{L_n} + \sum_{s=1}^{N_s} \|\vec{M}^p \cdot (\vec{X}_s^p - \vec{X}_s^{p-1})\|_{L_n} \right). \qquad (8)$$

As the $L_n$ norm for the regularization term, the $L_1$ norm can be used, for example.

In the definition of the regularization term, an estimation is applied to the mask, regarding image points in the respective time segments, at which flowing spins are present, or image points at which there are no flowing spins. This estimate can be obtained, for example, in that the raw data sets 31-34 acquired in a time segment are first transformed by means of a transformation from the k-space to the location space. These MR images in the spatial domain are of a lower quality than the images obtained through the solution of equation (2), but they enable, however, an identification of those image regions in which flowing spins are present. In addition, it is possible, for example, to compute a phase-contrast image in the conventional manner, in particular an MR angiogram, from the flow compensated MR image, which is defined by the raw data set 31, and the flow sensitive MR images, which are defined by the raw data sets 32-34. The phase-contrast image itself can be used as a mask for the regularization term. The mask can also be obtained from the phase-contrast image by means of further processing. Masks 40, 45 of this type are illustrated by way of example in FIG. 2.

The data obtained in this manner, regarding the positions of those image points where a flowing spin is present, is used for the definition of the regularization term in equation (2). The MR images for all time segments and all speed encodings are then defined by means of solving the equation (2) in an iterative manner.

Alternatively, or in addition thereto, other regularization terms than those terms described with reference to equations (6) and (8) can be used. The techniques described herein, for the local weighting of a temporal regularization dependent on flow speeds of spins can be used for different implementations of the regularization, e.g. in a TV regularization or a regularization with wavelets.

FIG. 3 is a flowchart for a method 50 according to an embodiment example. The method can be executed by the MR apparatus 10.

At step 51, an acquisition of raw data occurs. The raw data are acquired in parallel, using numerous receivers. The raw data can be recorded in two or three spatial dimensions. For each of the numerous time segments, a raw data set having a non-flow sensitive recording, and at least one further raw data set having a flow sensitive recording, are acquired. As many as three raw data sets, each having a flow sensitive recording, can be acquired in order to record data for three different speed encoding directions. A corresponding data acquisition can also occur for a different number of speed encoding directions. By way of example, a flow sensitive recording can occur for only one direction, for two directions, or for three directions, in order to detect the flow speeds of spins in the corresponding directions. A spatial dimension of the raw data (two-dimensional or three-dimensional) and a number of the different flow sensitive recordings can be combined in an arbitrary manner.

At step 52, a mask is calculated for numerous time segments, which is used for a spatially dependent weighting of differences in the temporal regularization term. The mask can be defined such that it is dependent on the flow speed of the spin. The mask can be defined such that, for flow sensitive MR images, temporal changes at an image point are then more strongly weighted in the regularization term, if the image point is a stationary image point.

At step 53, the MR images for all of the time segments and all of the speed encodings are defined simultaneously. For this, an iterative reconstruction method can be used. A vector, for which a target function is minimized, can be determined with an iterative solution method, as has been described in reference to equations (2) and (8).

For example, a phase-contrast MR angiogram can be computed, in each case, from the MR images obtained in this manner for the different time segments. Thus, a time-resolved MR angiography having a good contrast/noise relationship can be obtained.

FIG. 4 is a flowchart for a method 55, which more closely explains a calculation of the masks for the temporal regularization. At step 56, an iteration over different time segments is initiated.

The mask is defined in step 57, with which differences between a flow sensitive MR image for a time segment and a flow sensitive MR image in one of the adjacent time segments are weighted in a spatially resolved manner. For this, a phase-contrast image can first be defined from the raw data $\vec{Y}_{s,j}^{\,p}$, which are defined in the corresponding time segment p with the different receivers and for the different speed encodings. The mask can be calculated as a function of the speed data contained in the phase-contrast image. For this, the corresponding phase value in the phase-contrast image can be compared with a threshold value, for example, on a point-by-point basis. Depending on the threshold value comparison, the value for the mask at the corresponding image point can be set at a first value, or a second value. Thus, the mask can selectively concentrate a temporal regularization on those image points that have no flowing spins.

At step 58, the index p is incremented. If, at step 59, it is determined that the mask has not yet been determined for each of the time segments, the process returns to step 57. Otherwise, at step 60, an iterative reconstruction method is executed, in which the MR images are reconstructed. This can occur as described in reference to the equations (2) and (8).

FIG. 5 and FIG. 6 illustrate the definition of the phase-contrast image at step 52 of the method 50, or at step 57 of the method 55.

In order to estimate at which image points flowing spins are present, the raw data 31-34 are transformed to the location space. Each of the MR images 41-44 is computed directly from the raw data 31-34 allocated thereto, which are acquired with the numerous receivers 14a-14c. The sensitivity charts for the receivers are taken into account.

In the resulting MR images 41-44, the MR image 41 indicated by $I_o$ is the flow compensated MR image. The images indicated by $I_{s=1}$, $I_{s=2}$, and $I_{s=3}$ are flow sensitive MR images. For example, a phase-contrast image can be computed for image points as $$\sqrt{\sum_{s=1}^{N_s} |I_0 - I_s|^2} \,. \tag{9}$$

The corresponding phase-contrast image provides an estimation for that image region in which flowing spins are present. Despite any artifacts in the MR images 41-44 due to an underscanning during the data acquisition, the estimation is sufficient for a limiting of the temporal regularization to the image region in which there are no flowing spins present. The mask 40 for the corresponding time segment p can be defined from the speed data in the phase-contrast image, such that the temporal regularization is limited, in each case, to the image region in which there are no flowing spins present. Similarly, the mask 45 can be defined for another time segment p=2 by direct computation of the MR images 46-49 in the location space, computed from data sets 36-39, and subsequent computing of the phase-contrast image.

FIG. 6 illustrates a phase-contrast image 61, which can be obtained in the manner described in reference to FIG. 5. The phase-contrast image 61 has image regions 62-64, at which flowing spins are present. The phases in the phase-contrast image 61, or the corresponding flow speeds, respectively, can differ in the image regions 62-64.

A mask 66 for the temporal regularization can be defined from the phase-contrast image 61. In the image regions 62-64, corresponding to non-stationary image points, the mask 66 has a value that is less than a value at the stationary image points 68. At the non-stationary image points, where flowing spins are present, the mask 66 can have a value of zero or close to zero.

FIG. 7 illustrates the reconstruction of the MR images, which can occur as described in reference to the equations (2) and (8). In particular, a vector $\vec{x}$, which contains the image points of all of the MR images, can be defined in an iterative solution process for discovering the minimum value of a target function.

The target function, as given in equation (2), for example, is dependent on all of the raw data sets 21-24, 31-34, 36-39, which are acquired for the different time segments and different speed encodings. The regularization term for the temporal regularization is furthermore dependent on the masks 40, 45, with which temporal changes in image points are more strongly suppressed than temporal changes in non-stationary image points, in which flowing spins are present.

By an iterative determination of the vector $\vec{x}$, for which the target function is minimized, the image points for the MR images 71-74 for the time segment p=0, the MR images 81-84 for the time segment p=1, the MR images 86-89 for the time point p=0, etc. are calculated simultaneously. The images calculated for the different time segments through iterative reconstruction contain a non-flow sensitive MR image 71, 81, 86, and, in each case, at least one flow sensitive MR image 72-74, 82-84, 87-89. The reconstructed MR images can be further processed. For example, a phase-contrast MR angiogram 70 can be calculated from the MR images 71-74 according to equation (9).

With methods and MR apparatuses according to the embodiment examples, the data acquisition can occur in each case such that the raw data space is only incompletely filled with raw data. The points in the raw data space (k-space) are underscanned according to a scanning pattern.

The scanning patterns indicate which points in the raw data space are to be filled with raw data. Numerous different scanning patterns can be used for different speed encodings. The respective scanning patterns that are used can be permuted along the time axis, i.e. for the successive time segments.

FIG. 8 illustrates the use of different scanning patterns for different speed encodings for the raw data sets from FIG. 2.

In the time segment p=0, the raw data sets 21-24 are acquired. A first scanning pattern 91 is used for the flow compensated data acquisition (s=0), in order to acquire the raw data set 21. For the data acquisition (s=1), which is sensitive for a first flow direction, a second scanning pattern 92 is used, in order to acquire the raw data set 22. For the data acquisition (s=2), which is sensitive for a second flow direction, a third scanning pattern 93 is used, in order to acquire the raw data set 23. For the data acquisition (s=3), which is sensitive for a third flow direction, a fourth scanning pattern 94 is used, in order to acquire the raw data set 24.

The scanning patterns that are used are permuted in a time-dependent manner. Thus, the fourth scanning pattern 94 can be used, for example, for the data acquisition in the time segment p=1, for the flow compensated sequence, in order to acquire the raw data set 31. For the data acquisition with the first flow sensitive sequence, the first scanning pattern 91 can be used, in order to acquire the raw data set 32. For the data acquisition with the second flow sensitive sequence, the second scanning pattern 92 can be used, in order to acquire the raw data set 33. For the data acquisition with the third flow sensitive sequence, the third scanning pattern 93 can be used, in order to acquire the raw data set 94.

For subsequent time segments, the time-dependent permutation can be continued.

In different time segments, different scanning patterns can also be used. As an example, in a first time segment, a first group of scanning patterns can be used. In a second time segment, a second group of scanning patterns can be used. At least one of the scanning patterns in the second group can be different from all of the scanning patterns in the first group. Each pattern in the second group can be different from all of the patterns in the first group.

FIG. 9 illustrates the use of different scanning patterns for different speed encodings for the raw data sets in FIG. 2. Numerous scanning patterns 91-94 are used in one time segment. In another time segment, different scanning patterns 97-99 are used. At least one or more of the scanning patterns used in the acquisition of the raw data sets 31-34 can be different than the scanning patterns used in the acquisition of the raw data sets 21-24.

The scanning patterns 91-94 that are used can be selected such that each raw data point is contained in a central region 95 of the raw data space in at least one of the scanning patterns 91-94 that are used. Preferably, for each of the different time segments, each point in the central region 95 of the raw data space is covered by at least one of the scanning patterns 91-94.

As an example, for each of the scanning patterns 91-94, only every fourth line need be scanned in the central region 95 of the raw data space. The respective scanned lines can be shifted between the scanning patterns 91-94 such that the unification of all of the points contained in one of the scanning patterns 91-94 completely fills the raw data space of the central region 95. The scanning patterns 91-94 are nested in the central region 95, in order to completely cover, to the greatest extent possible, the central region 95.

Each of the scanning patterns 91-94 can have a regular, repeating point pattern in the central region 95 of the raw data space. Accordingly, the scanning in the central region 95 can occur in a coherent manner, with a consistent density. An outer region 96 of the raw data space, i.e. the region lying outside of the central region 95, can be scanned in an incoherent manner.

If different scanning patterns are used for different time segments, the scanning patterns for each of the time segments can be selected in the manner described above. As an example, the respective scanning pattern used for each of time segments can be selected such that each point in the central region 95 of the raw data space is covered by at least one of the scanning patterns.

By a selection of the scanning patterns in this manner, it can be ensured that data acquisitions with different speed encodings and from different time segments contribute to an overall good contrast/noise relationship.

FIG. 10 shows other examples of 3-dimensional raw data spaces 100-120. The inner, central region 101, 111, 121 of the raw data space is scanned in a coherent manner in each case. The pattern in the region 101 has, for example; a triple underscanning, in which only every third line in the phase encoding direction is read. Depending on the number of different speed encodings, other underscannings can also be used. If, for example, as is depicted in FIG. 8 and FIG. 9, four data acquisitions are made with different speed encodings, a quadruple underscanning can be used. The outer raw data regions 102, 112, 122, lying outside the central region 101, 111, 121, are recorded with a density that diminishes as it recedes from the center.

The central region of the raw data space can have an arbitrary shape about the center thereof, i.e., around the center of k-space. This central region can be circular, quadratic, elliptical, or rectangular.

Further examples for possible scanning patterns are described in DE 10 2011 081 411.6. With embodiment examples from the present invention, these different scanning patterns are advantageously used for recording sequences with different speed encodings, as explained in reference to FIG. 8.

Methods and apparatuses according to embodiment examples provide very good results in phase-contrast MR angiography. While, for example, an underscanning with subsequent iterative reconstruction leads to significant diminishing of the contrast/noise relationship, in comparison with a complete scanning of the raw data, if no temporal regularization is used, the contrast/noise relationship can be restored by means of the techniques described herein.

Figure 12:
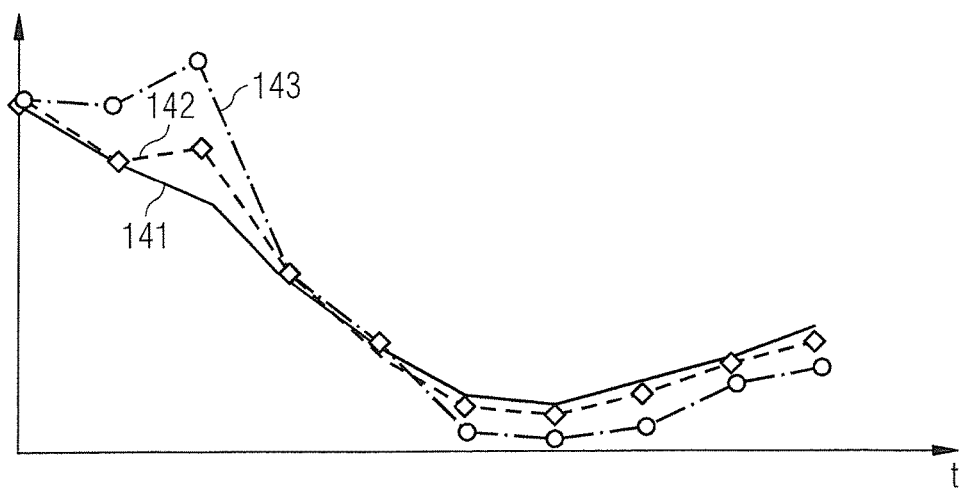

FIG. 11 and FIG. 12 show results, which can be obtained with the methods and MR apparatuses according to the embodiment examples, in comparison with results that are obtained with a complete scanning of the raw data space. The data obtained with the complete scanning of the raw data space are depicted as reference curves 131, 141.

The flow speed 132, 142 is determined with methods and MR apparatuses according to the embodiment examples. An underscanning is carried out with different scanning patterns in combination with temporal regularization in the iterative reconstruction. The determined time-dependent flow speeds 132, 142 follow the reference curves 131, 141 well. The overall time required for the data acquisition can be substantially reduced, in comparison with a complete scanning of the raw data space, with methods and MR apparatuses according to the embodiment examples.

FIG. 12 furthermore shows, for comparison purposes, the flow speed 143, which one gets without temporal regularization, i.e. for α=0 in equation (2). The temporal regularization results in a significant improvement to the alignment with the reference curve 141.

Although methods and apparatuses according to the embodiment examples have been described, variations thereof can also be implemented in other embodiment examples. By way of example, it is also possible to use a smaller or larger number of sequences with different speed encodings in each time segment. It is possible to acquire only two raw data sets, corresponding to a flow compensated sequence and a flow sensitive sequence. It is also possible to acquire six or more raw data sets, which correspond to a flow compensated sequence and at least five flow sensitive sequences.

While the iterative reconstruction can be carried out using Newtonian iteration methods, other iterative techniques can also be used, with which the argument for minimizing the target function can be found.

The methods and MR apparatuses according to the exemplary embodiment described herein can be used for phase-contrast angiography.

Although modifications and changes may be suggested by those skilled in the art, it is the intention of the inventors to embody within the patent warranted hereon all changes and modifications as reasonably and properly come within the scope of their contribution to the art.

We claim as our invention:

1. A method for time-resolved phase-contrast magnetic resonance (MR) imaging with speed encoding, comprising:
operating an MR data acquisition unit comprising a plurality of radio-frequency (RF) receivers to acquire MR signals originating from stationary nuclear spins and non-stationary nuclear spins in an examination subject situated in the MR data acquisition unit, using multiple RF receivers among said plurality of RF receivers, in each of a plurality of time segments, with different speed encodings;
for each of said time segments, entering raw data, corresponding to the MR signals detected in the respective time segment, into an electronic memory as raw data points;
in a processor having access to said electronic memory, reconstructing intermediate images from said raw data, and automatically identifying in said intermediate images, stationary image points originating from said stationary nuclear spins and non-stationary image points originating from said non-stationary nuclear spins;
in said processor, defining a mask comprised of mask values that differ within said mask dependent on said stationary image points and said non-stationary image points; and
in said processor, reconstructing a plurality of final MR images respectively from the MR signals acquired in the respective segments by executing an iterative reconstruction algorithm with a temporal regularization that is dependent on said mask.

2. A method as claimed in claim 1 comprising defining and using said mask to suppress time-dependent changes in said stationary raw data points in the reconstruction of said MR images.

3. A method as claimed in claim 1 comprising, in said reconstruction algorithm, minimizing a target function that comprises a regularization term for said temporal regularization, and using said mask to provide a spatially-dependent weighting for said regularization term.

4. A method as claimed in claim 3 comprising calculating said regularization term as a difference between a first of said MR images and a second of said MR images respectively allocated to successive time segments among said plurality of time segments, and weighting said difference with said mask dependent on whether a raw data point is a stationary raw data point or a non-stationary raw data point.

5. A method as claimed in claim 4 wherein said target function is dependent on raw data acquired in respective, different time segments among said plurality of time segments.

6. A method as claimed in claim 3, wherein the regularization term is a function of $$\|\vec{M}^p \cdot (\vec{X}_s^p - \vec{X}_s^{p-1})\|_{L_n}$$

wherein p is an index for a time segment, s is an index for a speed encoding, $\vec{M}^p$ is the mask (40, 45; 66) for a $p^{th}$ time segment, $\vec{X}_s^p$ is a vector with image points of an MR image for the $p^{th}$ time segment, $\vec{X}_s^{p-1}$ is a vector with image points of an MR image for the $(p-1)^{th}$ time segment, and $\|\cdot\|_{L_n}$ indicates an $L_n$ norm.

7. A method as claimed in claim 1 comprising identifying said stationary raw data points and said non-stationary raw data points, and defining said mask, for each of multiple time segments among said plurality of time segments.

8. A method as claimed in claim 7 comprising, for each time segment, generating a phase-contrast image, as said intermediate image, for the respective time segment and identifying the stationary raw data points and the non-stationary raw data points as stationary image points and non-stationary image points respectively, in the respective phase-contrast image, and generating said mass from the respective phase-contrast image using a threshold value comparison.

9. A method as claimed in claim 1 comprising, in each of time segments, detecting said MR signals with a respectively different speed encodings that causes a raw data portion of said memory, reserved for the respective time segment, to be incompletely filled with raw data points.

10. A method as claimed in claim 9 comprising entering said MR signals into each region as raw data points according to a scanning pattern that is different for the respective different speed encodings.

11. A method as claimed in claim 10 comprising nesting said different scanning patterns in a central region of said memory, with each point in said central region being scanned according to at least one of said different scanning patterns.

12. A method as claimed in claim 10 comprising allocating the different scanning patterns to respective speed encodings in a time-dependent permutation.

13. A magnetic resonance (MR) apparatus for time-resolved phase-contrast MR imaging with speed encodings, comprising:
an MR data acquisition unit configured to receive an examination subject therein, and comprising a plurality of radio-frequency (RF) receivers;
a control unit configured to operate said MR data acquisition unit to acquire MR signals originating from stationary nuclear spins and non-stationary nuclear spins in an examination subject situated in the MR data acquisition unit, using multiple RF receivers among said plurality of RF receivers, in each of a plurality of time segments, with different speed encodings;
said control unit being configured, for each of said time segments, to enter raw data, corresponding to the MR signals detected in the respective time segment into an electronic memory as raw data points;

a processor having access to said electronic memory, said processor being configured to reconstruct intermediate images from said raw data and to automatically identify, in said intermediate images, stationary image points originating from said stationary nuclear spins and non-stationary image points originating from said non-stationary nuclear spins;

said processor being configured to define a mask comprised of mask values that differ within said mask dependent on said stationary image points and said non-stationary image points; and said processor being configured to reconstruct a plurality of final MR images respectively from the MR signals acquired in the respective segments by executing an iterative reconstruction algorithm with a temporal regularization that is dependent on said mask.

14. A method for time-resolved magnetic resonance (MR) imaging with speed encoding comprising:

operating an MR data acquisition unit, comprising a plurality of radio-frequency (RF) receivers to acquire MR signals with multiple RF receivers among said plurality of RF receivers in each of a plurality of time segments by acquiring said MR signals, in each time segment, with a respectively different speed encoding;

operating said MR data acquisition unit to acquire said MR signals, in each time segment, with one of said different speed encodings that causes raw data, corresponding to the acquired MR signals, to be entered into a region of an electronic memory that incompletely fills said region, according to a scanning pattern, and using a different scanning pattern for each respective different speed encoding; and in a processor, reconstructing a plurality of MR images from the raw data in said memory acquired during each of said time segments.

15. A method as claimed in claim 14 comprising nesting said different scanning patterns in a central region of said memory, with each point in said central region being scanned according to at least one of said different scanning patterns.

16. A method as claimed in claim 15 comprising selecting said different scanning patterns to cause a density of raw data points outside of said central region to be less than a density of raw data points within said central region.

17. A method as claimed in claim 15 comprising entering said raw data points into said central region in a coherent manner, and entering raw data points outside of said central region in an incoherent manner.

18. A method as claimed in claim 14 comprising allocating the different scanning patterns to respective speed encodings in a time-dependent permutation.

19. A magnetic resonance (MR) apparatus for time-resolved phase-contrast MR imaging with speed encodings, comprising:

an MR data acquisition unit configured to receive an examination subject therein, and comprising a plurality of radio-frequency (RF) receivers;

a control unit configured to operate to the MR data acquisition unit to acquire MR signals from the examination subject with multiple RF receivers among said plurality of RF receivers in each of a plurality of time segments by acquiring said MR signals, in each time segment, with a respectively different speed encoding;

said control unit being configured to operate said MR data acquisition unit to acquire said MR signals, in each time segment, with one of said different speed encodings that causes raw data, corresponding to the acquired MR signals, to be entered into a region of an electronic memory that incompletely fills said region, according to a scanning pattern, and using a different scanning pattern for each respective different speed encoding; and a processor configured to reconstruct a plurality of MR images from the raw data in said memory acquired during each of said time segments.

* * * * *